(12) United States Patent
Tsumura

(10) Patent No.: US 12,433,033 B2
(45) Date of Patent: Sep. 30, 2025

(54) ESD PROTECTION CIRCUIT AND SEMICONDUCTOR DEVICE

(71) Applicant: ABLIC Inc., Tokyo (JP)

(72) Inventor: Kazuhiro Tsumura, Tokyo (JP)

(73) Assignee: ABLIC Inc., Tokyo (JP)

( * ) Notice: Subject to any disclaimer, the term of this patent is extended or adjusted under 35 U.S.C. 154(b) by 399 days.

(21) Appl. No.: 18/184,629

(22) Filed: Mar. 15, 2023

(65) Prior Publication Data

US 2023/0299072 A1 Sep. 21, 2023

(30) Foreign Application Priority Data

Mar. 18, 2022 (JP) .................................. 2022-043270
Dec. 27, 2022 (JP) .................................. 2022-209355

(51) Int. Cl.
*H10D 89/60* (2025.01)

(52) U.S. Cl.
CPC ......... *H10D 89/611* (2025.01); *H10D 89/814* (2025.01)

(58) Field of Classification Search
CPC .. H10D 89/611; H10D 89/814; H05K 1/0259; H05K 9/0067; H05K 9/0079
See application file for complete search history.

(56) References Cited

U.S. PATENT DOCUMENTS

| 7,583,485 B1* | 9/2009 | Luo | H10D 89/813 |
| | | | 361/111 |
| 2007/0090392 A1* | 4/2007 | Boselli | H10D 8/80 |
| | | | 257/107 |
| 2007/0096793 A1* | 5/2007 | Kato | H10D 89/811 |
| | | | 327/524 |
| 2013/0321968 A1* | 12/2013 | Simmonds | H10D 89/611 |
| | | | 361/91.5 |
| 2019/0206857 A1* | 7/2019 | Lin | H01L 23/528 |
| 2020/0111778 A1* | 4/2020 | Lai | H10D 89/811 |
| 2023/0207554 A1* | 6/2023 | Mueller | H10D 8/60 |
| | | | 361/56 |

FOREIGN PATENT DOCUMENTS

| JP | 2003023084 | 1/2003 |
| JP | 2011181848 | 9/2011 |

* cited by examiner

Primary Examiner — Yasser A Abdelaziz
(74) Attorney, Agent, or Firm — JCIPRNET

(57) ABSTRACT

An ESD protection circuit is connected between a $V_{DD}$ terminal and a $V_{SS}$ terminal and is connected in parallel with an internal circuit which operates at an operating voltage and is damaged at a damage voltage or higher to protect the internal circuit from electrostatic discharge. The ESD protection circuit includes ESD protection elements connected in series. The ESD protection elements are transistors, diode elements, or a combination thereof. A sum of current-voltage characteristics of the ESD protection elements at a voltage higher than the operating voltage is higher than the operating voltage and lower than the damage voltage, until reaching a discharge current value or higher capable of protecting the internal circuit.

11 Claims, 15 Drawing Sheets

ESD PROTECTION CIRCUIT AND SEMICONDUCTOR DEVICE

CROSS-REFERENCE TO RELATED APPLICATION

This application claims the priority benefit of Japan application serial no. 2022-043270, filed on Mar. 18, 2022 and Japan application serial no. 2022-209355, filed on Dec. 27, 2022. The entirety of the above-mentioned patent applications is hereby incorporated by reference herein and made a part of this specification.

BACKGROUND

Technical Field

The present invention relates to an ESD protection circuit and a semiconductor device.

Related Art

A semiconductor integrated circuit is susceptible to electrostatic discharge (ESD) and may be easily damaged. Specifically, if a semiconductor integrated circuit includes an element in a metal-oxide-semiconductor (MOS) structure, electric field damage such as gate dielectric breakdown would often occur. Thus, the semiconductor integrated circuits generally include an ESD protection circuit for protecting an internal circuit from electrostatic discharge.

Examples of the ESD protection circuit include, for example, a diode-type ESD protection circuit utilizing the breakdown phenomenon, and a gate grounded (gg) NMOS-type ESD protection circuit utilizing the snapback operation of an N-channel MOS (NMOS) transistor.

As a diode-type ESD protection circuit, for example, it has been proposed to expand the allowable voltage range of an external connection terminal in proportion to the quantity of diodes by connecting two or more series-connected diode strings between the external connection terminal connected to an internal circuit and a power supply line.

As a ggNMOS-type ESD protection circuit, for example, an ESD protection circuit has been proposed to have a layout area which can be reduced by connecting ESD protection elements between a plurality of power supply terminals with different power supply voltages.

SUMMARY

An ESD protection circuit according to an embodiment of the present invention is connected between a first terminal and a second terminal and is connected in parallel with a protected circuit which operates at an operating voltage and is damaged at a damage voltage or higher to protect the protected circuit from electrostatic discharge. The ESD protection circuit includes a plurality of ESD protection elements connected in series. The plurality of ESD protection elements are transistors, diode elements, or a combination thereof. A sum of current-voltage characteristics of the plurality of ESD protection elements at a voltage higher than the operating voltage is higher than the operating voltage and lower than the damage voltage, until reaching a discharge current value or higher capable of protecting the protected circuit.

According to an aspect of the present invention, it is possible to provide an ESD protection circuit corresponding to the operating voltage and the damage voltage of the protected circuit.

DESCRIPTION OF THE EMBODIMENTS

In a ggNMOS type ESD protection circuit, a gate and a source of an N-channel MOS (NMOS) transistor are connected to a ground potential, and in the case where a positive surge voltage is applied to a terminal connected to a drain, the drain terminal of the NMOS transistor breaks down. In the case where a product of an avalanche current generated by this breakdown and a substrate resistance exceeds a diffusion barrier voltage (about 0.6 V) of a PN junction, a parasitic NPN bipolar transistor operates. With the operation of this parasitic bipolar transistor, upon start of flow of a discharge current between the drain and the source, the drain voltage temporarily drops to a holding voltage Vh, and the voltage rises as the discharge current gradually increases.

An ESD protection circuit which utilizes such a snapback operation may not be able to protect a protected circuit if a trigger voltage and a holding voltage in the snapback operation are not set to be higher than an operating voltage of the protected circuit and lower than a damage voltage. Further, a breakdown voltage of a parasitic diode in the NMOS transistor may be set to be higher than the operating voltage to be able to reduce a leak current during operation of the protected circuit. The operating voltage is a predetermined voltage at which the protected circuit is able to operate, and the operating voltage is not limited to, for example, a range from a minimum operating voltage to a maximum operating voltage described in the specification, but also covers a range of voltage at which the protected circuit actually operates. Specifically, in the case where the actual maximum operating voltage is 30 V and the minimum start-up voltage in the ESD protection circuit is 35 V but the specification stipulates a maximum operating voltage of 40 V, the actual operating voltage is considered. The damage voltage refers to a voltage at which the protected circuit may be damaged. If the trigger voltage, which is higher than the breakdown voltage, is higher than the damage voltage of the protected circuit, the protected circuit would be damaged. With the holding voltage being lower than the maximum operating voltage, once the parasitic NPN bipolar transistor operates, even after the surge voltage is applied, the current generated due to the parasitic NPN bipolar transistor would continue to flow.

Setting all of the breakdown voltage, the trigger voltage, and the holding voltage to be higher than the maximum operating voltage of the protected circuit and lower than the damage voltage of the protected circuit is easy to implement for a protected circuit with a low withstand voltage, but is difficult to implement for a protected circuit with a high withstand voltage.

Figure 13:
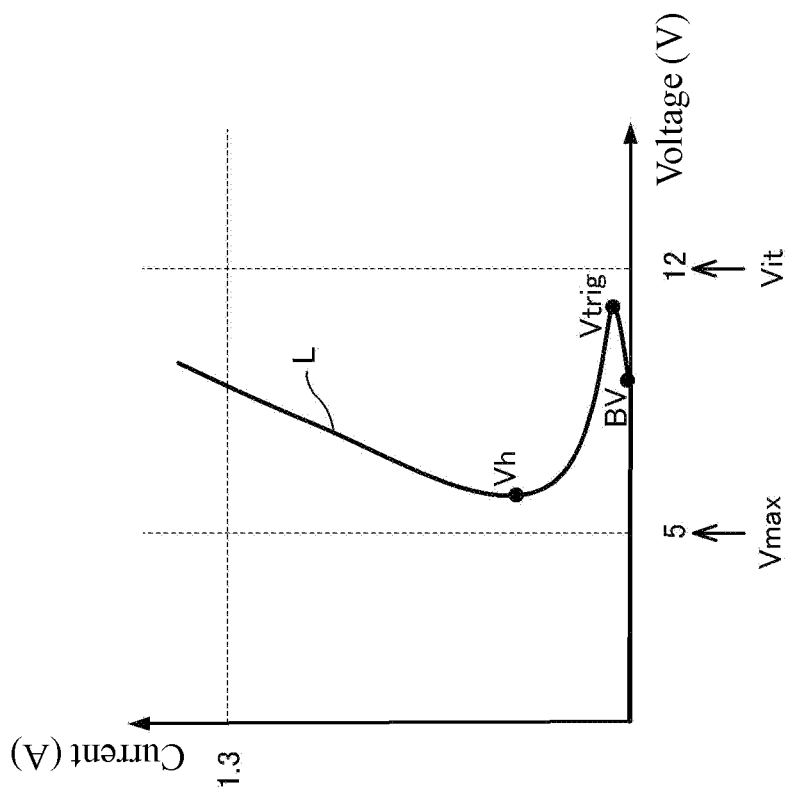
FIG. 13 is a graph illustrating a current-voltage characteristic of a conventional ESD protection circuit with a low withstand voltage.

For example, for a protected circuit with a low withstand voltage having a maximum operating voltage of 5 V and a damage voltage of 12 V, as indicated by L in FIG. 13, it is easy to set all of a breakdown voltage BV, a trigger voltage Vtrig, and a holding voltage Vh to be higher than a maximum operating voltage Vmax and lower than a damage voltage Vit of the protected circuit. Specifically, in the case where an NMOS transistor with a withstand voltage of 5 V is applied to the ggNMOS type ESD protection circuit, the breakdown voltage BV is 9 V, the trigger voltage Vtrig is 11 V, and the holding voltage Vh is 6 V, and it is easy to set these three parameters to be higher than the maximum operating voltage Vmax of 5 V and lower than the damage voltage Vit of 12 V. Such an ESD protection circuit with a low withstand voltage may have a layout area of about 70 μm×70 μm.

Next, consider a case of applying a structure with an increased collector-emitter resistance of a parasitic bipolar transistor to a protected circuit with a high withstand voltage having a maximum operating voltage Vmax of 100 V and a damage voltage Vit of 140 V. In this case, as indicated by A in FIG. 14, the breakdown voltage BV is set to 120 V, and compared to L of FIG. 13 presented in the scale of FIG. 14, the holding voltage Vh is often not sufficiently high.

Figure 14:
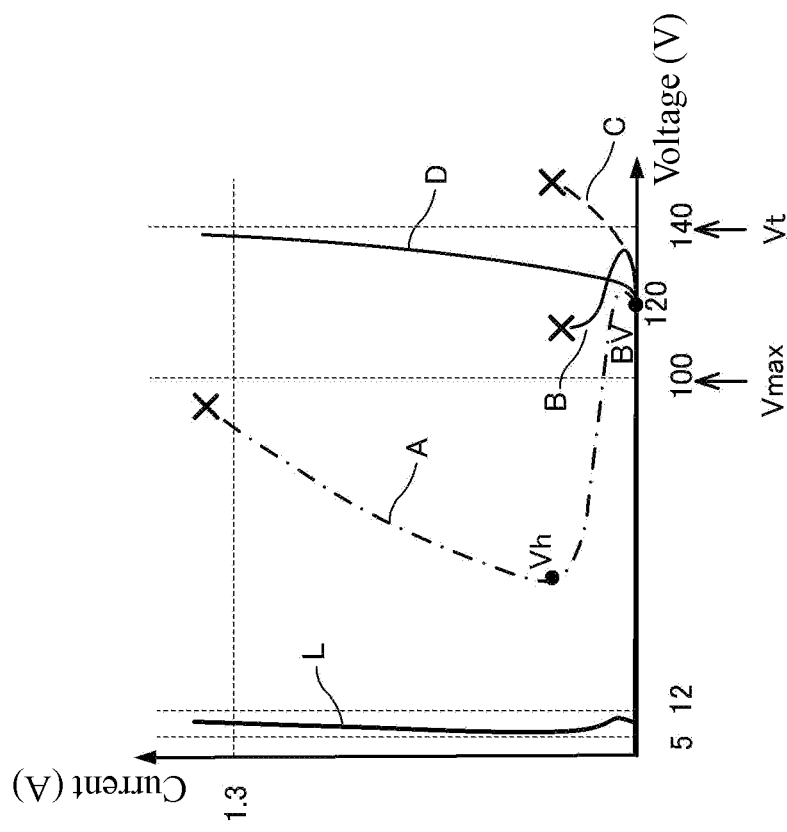
FIG. 14 is a graph illustrating current-voltage characteristics of conventional ESD protection circuits with a low withstand voltage and a high withstand voltage.

In the case where the holding voltage Vh is to be set higher than the maximum operating voltage Vmax of the protected circuit, even if snapback operation occurs, the collector-emitter resistance of the parasitic bipolar transistor becomes too large to allow a large discharge current to flow, and thus as indicated by B in FIG. 14, the protected circuit is damaged. On the other hand, in the case where the breakdown voltage of the parasitic diode is increased, as indicated by C in FIG. 14, the trigger voltage becomes higher than the damage voltage of the protected circuit, and the protected circuit is damaged.

In the case where a gate width W is increased, as indicated by D in FIG. 14, the current reaches 1.3 A while the voltage gradually increases without occurrence of the snapback operation.

In this manner, it is possible to function as an ESD protection circuit, but the layout area increases to a size exceeding 400 μm×400 μm for a protected circuit with a high withstand voltage having a maximum operating voltage of about 100 V.

Thus, an ESD protection circuit according to an embodiment of the present invention combines a plurality of ESD protection elements corresponding to an operating voltage and a damage voltage of a protected circuit.

Hereinafter, embodiments of the present invention will be described in detail with reference to the drawings. In the drawings, the same components may be labeled with the same reference signs, and repeated descriptions may be omitted. Also, the X-axis, the Y-axis, and the Z-axis illustrated in the drawings are assumed to be orthogonal to each other. The X-axis direction may be referred to as a "width direction", the Y-axis direction may be referred to as a "depth direction", and the Z-axis direction may be referred to as a "height direction" or "thickness direction". The surface of each film on the +Z direction side may be referred to as a "front surface" or "upper surface", and the surface on the –Z direction side may be referred to as a "back surface" or "lower surface". Further, the drawings are schematic, and the width, depth, and thickness ratios etc. may not be exactly as illustrated in the drawings. The quantity, position, shape, structure, size, etc. of a plurality of films or layers, or a semiconductor device obtained by structurally combining the films or layers may be set to desired quantity, position, shape, structure, size, etc. for carrying out the present invention without being limited to the embodiments illustrated below.

Figure 1:
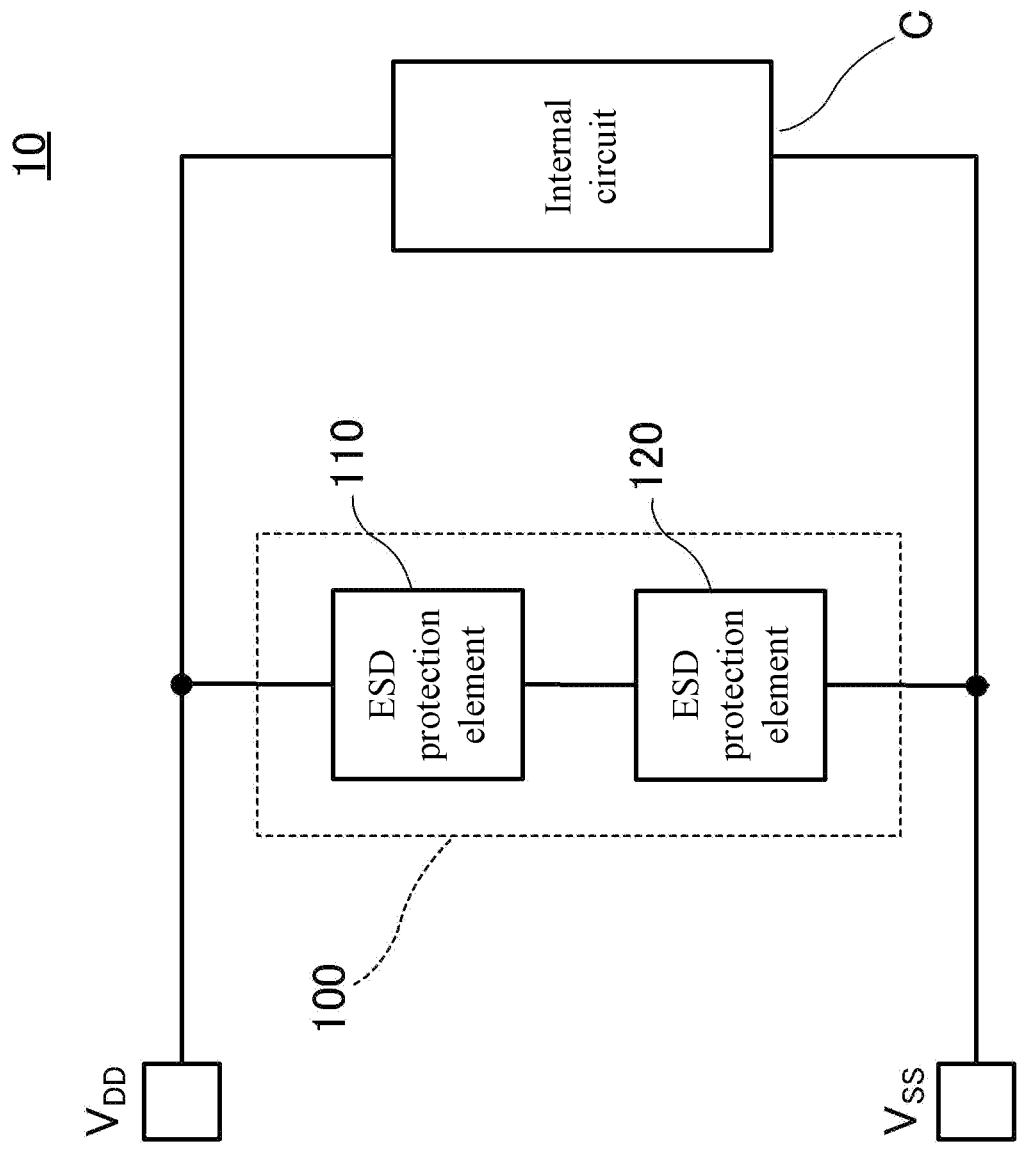
FIG. 1 is a circuit diagram illustrating an example of an ESD protection circuit and a semiconductor device according to the present invention.

FIG. 1 is a circuit diagram illustrating an example of an ESD protection circuit and a semiconductor device according to the present invention. As illustrated in FIG. 1, a semiconductor device 10 according to an embodiment of the present invention includes an ESD protection circuit 100 and an internal circuit C. The ESD protection circuit 100 according to an embodiment of the present invention is connected between a $V_{DD}$ terminal serving as a first terminal and a $V_{SS}$ terminal serving as a second terminal, and is connected in parallel with the internal circuit C.

The internal circuit C is a protected circuit to be protected by the ESD protection circuit 100 from electrostatic discharge, and operates at an operating voltage applied between the $V_{DD}$ terminal and the $V_{SS}$ terminal which is at a ground potential. The internal circuit C operates at an operating voltage equal to or lower than a predetermined maximum operating voltage Vmax, and may be damaged at a predetermined damage voltage Vit or higher.

The ESD protection circuit 100 is a circuit which protects the internal circuit C from being damaged by electrostatic discharge. The ESD protection circuit 100 includes a plurality of ESD protection elements 110 and 120 connected in series. The ESD protection elements 110 and 120 are MOS transistors, diode elements, or combinations thereof. That is, the ESD protection elements 110 and 120 may be both MOS transistors, both diode elements, or may be a combination of a MOS transistor and a diode element. By appropriately selecting the ESD protection elements 110 and 120, within a discharge current range capable of protecting the internal circuit C, a sum of current-voltage characteristics of the ESD protection elements 110 and 120 is set to be higher than the operating voltage and lower than the damage voltage of the internal circuit C. Thus, the ESD protection circuit 100 can obtain a current-voltage characteristic corresponding to the operating voltage and the damage voltage of the internal circuit C and can avoid damage due to electrostatic discharge without interfering with the operation of the internal circuit C.

In FIG. 1, the plurality of ESD protection elements are the two ESD protection elements 110 and 120, but the embodiment is not limited thereto, and the plurality of ESD protection elements may also combine at least two or more ESD protection elements. Also, as long as the sum of current-voltage characteristics of the plurality of ESD protection elements can be set to be higher than the operating voltage and lower than the damage voltage of the internal circuit, the MOS transistor may be an N-channel or P-channel MOS transistor, and may have a withstand voltage equal to or different from other ESD protection elements. The diode element may have a withstand voltage equal to or different from other ESD protection elements.

To illustrate these variations, three embodiments will be provided below. In a first embodiment, an ESD protection circuit combining a low withstand voltage NMOS transistor and a low withstand voltage P-channel MOS (PMOS) transistor will be described. In a second embodiment and its modification example, an ESD protection circuit combining a high withstand voltage NMOS transistor and a low withstand voltage NMOS transistor will be described. In a third embodiment, an ESD protection circuit combining a high withstand voltage diode element and a low withstand voltage MOS transistor will be described.

In each of the embodiments, "low withstand voltage" is a voltage around 5 V, and "high withstand voltage" is a voltage around 100 V, but the embodiments are not limited thereto. Further, to protect against electrostatic discharge of 2 kV in the human body model (HBM), it would be sufficient to allow a discharge current of 1.3 A to flow, so the "discharge current value capable of protecting the internal circuit" in each of the embodiments is set to be 1.3 A, but the embodiments are not limited thereto.

First Embodiment

Figure 2:
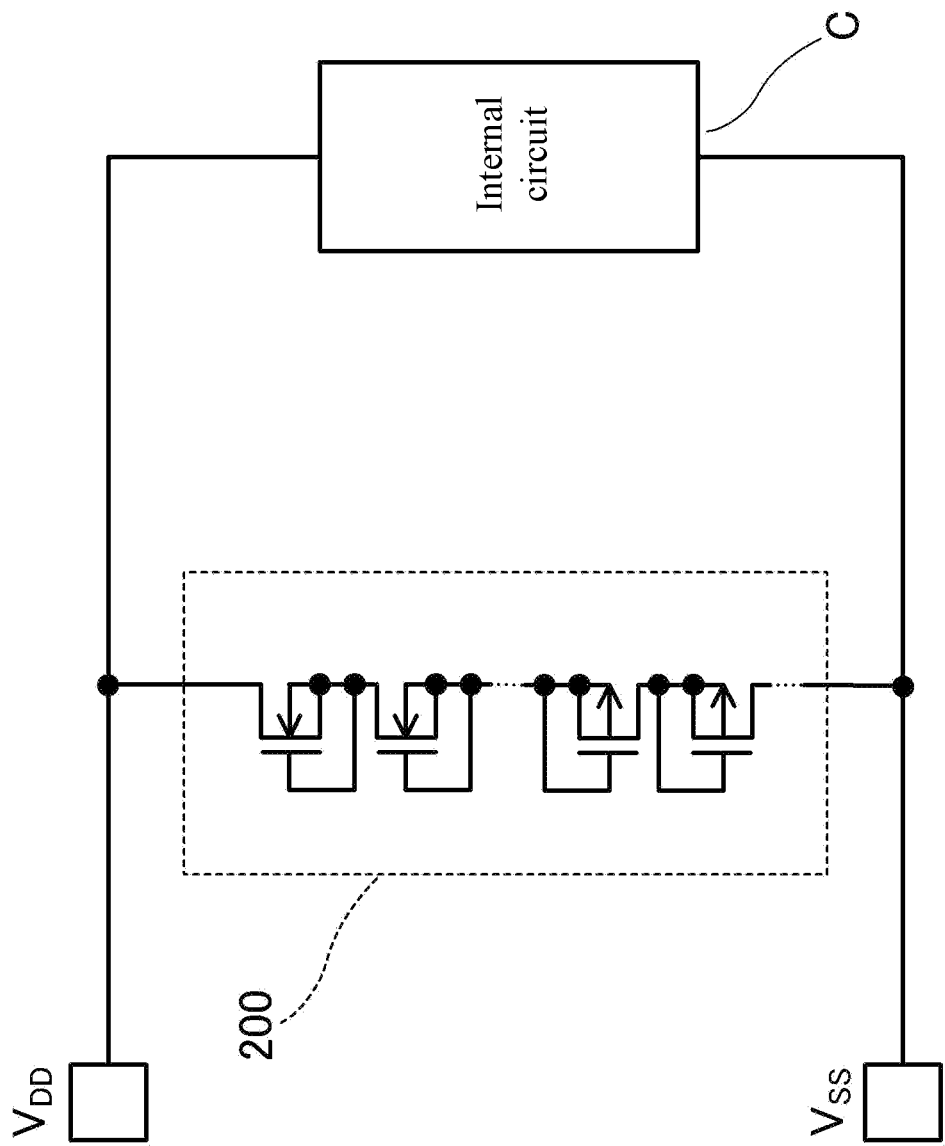
FIG. 2 is a circuit diagram illustrating an example of an ESD protection circuit and a semiconductor device according to a first embodiment.

FIG. 2 is a circuit diagram illustrating an example of an ESD protection circuit and a semiconductor device according to the first embodiment. An ESD protection circuit 200 of a semiconductor device 20 according to the first embodiment is formed by appropriately selecting a total of 12 transistors from low withstand voltage NMOS transistors and low withstand voltage PMOS transistors and connecting them in series. FIG. 2 illustrates that the ESD protection circuit 200 is formed by connecting the low withstand voltage NMOS transistors and the low withstand voltage PMOS transistors in series. The low withstand voltage NMOS transistors and the low withstand voltage PMOS transistors are so-called diode-connected, with gate terminals being respectively connected to source terminals. Further, in FIG. 2, the low withstand voltage NMOS transistors are arranged on the $V_{DD}$ terminal side, and the low withstand voltage PMOS transistors are arranged on the $V_{SS}$ terminal side, but the low withstand voltage PMOS transistors may also be arranged on the $V_{DD}$ terminal side, and the low withstand voltage NMOS transistors may also be arranged on the $V_{SS}$ terminal side. In either case, equivalent breakdown voltage BV, trigger voltage Vtrig, and holding voltage Vh may be obtained. However, since the ESD tolerance may change depending on the arrangement sequence, the desired arrangement sequence is appropriately selected. Furthermore, regarding the arrangement sequence, since the ESD tolerance may differ depending on not only the N-channel or P-channel of the MOS transistor but also the arrangement sequence of the ESD protection elements, an appropriate selection is made.

Figure 3:
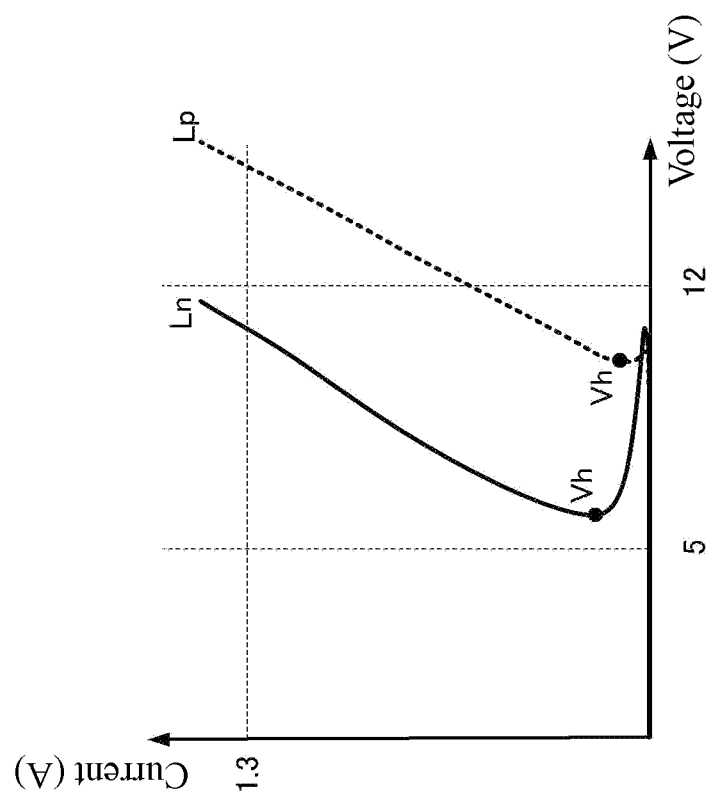
FIG. 3 is a graph illustrating an example of current-voltage characteristics in the case where an ESD protection element is a low withstand voltage MOS transistor.

FIG. 3 is a graph illustrating an example of current-voltage characteristics in the case where the ESD protection element is a low withstand voltage MOS transistor. In the case where the ESD protection element is a low withstand voltage NMOS transistor, its current-voltage characteristic is as indicated by Ln in FIG. 3. In the case where the ESD protection element is a low withstand voltage PMOS transistor, its current-voltage characteristic is as indicated by Lp in FIG. 3. Comparing Ln and Lp, in the NMOS transistor, the snapback operation is larger, the holding voltage Vh is lower, and the voltage for 1.3 A to flow is lower than in the PMOS transistor. Conversely, in the PMOS transistor, the snapback operation is smaller, the holding voltage Vh is higher, and the voltage for 1.3 A to flow is higher than in the NMOS transistor.

Figure 4:
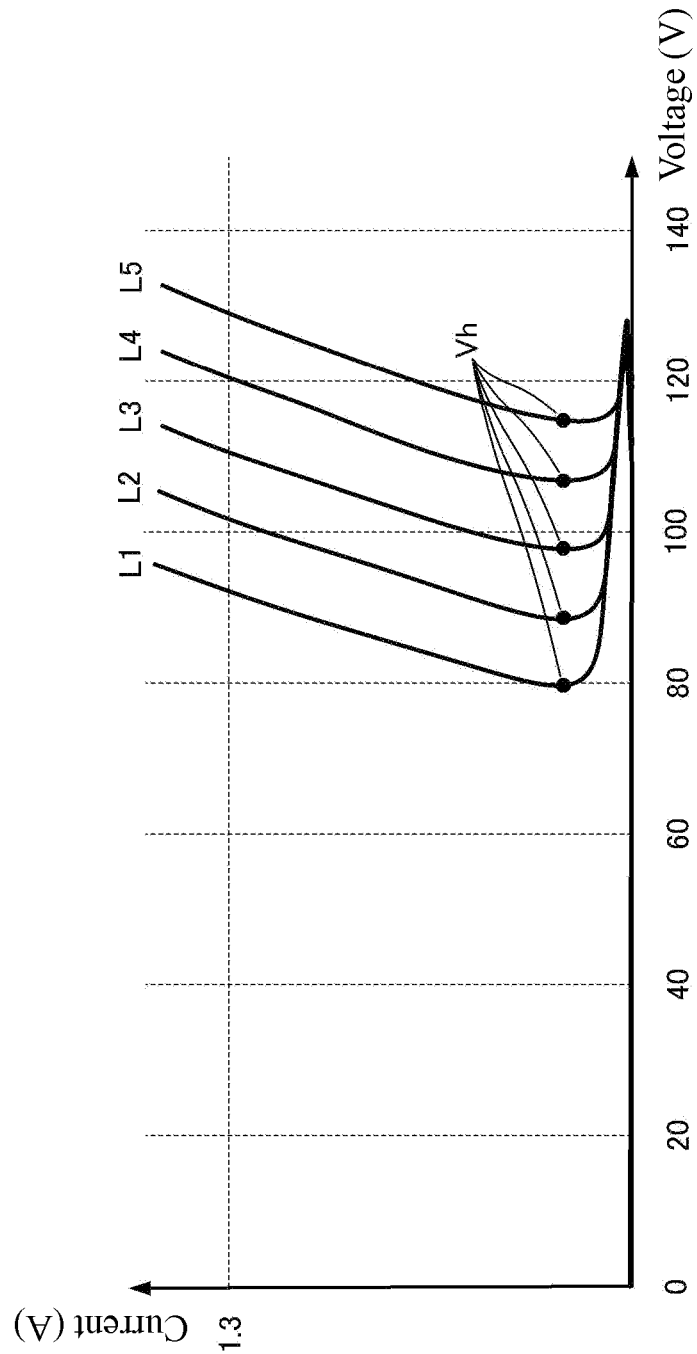
FIG. 4 is a graph illustrating some examples of the current-voltage characteristic of the ESD protection circuit according to the first embodiment.

Next, the current-voltage characteristic of the ESD protection circuit 200 combining the low withstand voltage NMOS transistor and the low withstand voltage PMOS transistor will be described. FIG. 4 is a graph illustrating some examples of the current-voltage characteristic of the ESD protection circuit according to the first embodiment. L1 to L5 in FIG. 4 illustrate current-voltage characteristics of the ESD protection circuit 200 formed by connecting the low withstand voltage NMOS transistor and the low withstand voltage PMOS transistor in series in the following quantities.

L1: 12 low withstand voltage NMOS transistors
L2: 9 low withstand voltage NMOS transistors, 3 low withstand voltage PMOS transistors
L3: 6 low withstand voltage NMOS transistors, 6 low withstand voltage PMOS transistors
L4: 3 low withstand voltage NMOS transistors, 9 low withstand voltage PMOS transistors
L5: 12 low withstand voltage PMOS transistors As illustrated in FIG. 4, in the current-voltage characteristic of the ESD protection circuit 200, the larger the ratio of the low withstand voltage NMOS transistor, the larger the snapback operation, and thus the lower the holding voltage Vh. Thus, in the ESD protection circuit 200 with a large ratio of low withstand voltage NMOS transistors, if the holding voltage Vh is higher than the operating voltage of the internal circuit C, the voltage for flowing the discharge current of 1.3 A required for protecting against electrostatic discharge of 2 kV in the HBM can be easily set to be lower than the damage voltage of the internal circuit C. Furthermore, if the ESD protection circuit 200 can adjust the holding voltage Vh to decrease to around the operating voltage of the internal circuit C, before the discharge voltage due to electrostatic discharge approaches the damage voltage of the internal circuit C, the discharge current can easily flow, and the internal circuit C can be more reliably protected from electrostatic discharge.

From this point of view, for example, in the case where the damage voltage of the internal circuit C is 140 V and the operating voltage of the internal circuit C is 70 V, since the current-voltage characteristic indicated by L1 in FIG. 4 is optimal, the ESD protection circuit 200 may be formed of 12 low withstand voltage NMOS transistors. Also, in the case where the operating voltage of the internal circuit C is 90 V, since the current-voltage characteristic indicated by L3 in FIG. 4 is optimal, the ESD protection circuit 200 may be formed of six low withstand voltage NMOS transistors and six low withstand voltage PMOS transistors. Furthermore, in the case where the operating voltage of the internal circuit C is 100 V, since the current-voltage characteristic indicated by L4 in FIG. 4 is optimal, the ESD protection circuit 200 may be formed of three low withstand voltage NMOS transistors and nine low withstand voltage PMOS transistors.

Thus, by combining the low withstand voltage NMOS transistor and the low withstand voltage PMOS transistor, the ESD protection circuit 200 according to the first embodiment can obtain a current-voltage characteristic corresponding to the operating voltage and the damage voltage of the internal circuit C. In particular, since the snapback operation becomes larger as the ratio of low withstand voltage NMOS transistors increases, the ESD protection circuit 200 can allow the discharge current required for protecting the internal circuit C to flow at a lower voltage, and can protect the internal circuit C more reliably. Although 12 low withstand voltage MOS transistors are used in the first embodiment, the quantity of MOS transistors is not limited as long as an optimal current-voltage characteristic can be obtained using the plurality of MOS transistors.

Second Embodiment

Figure 5:
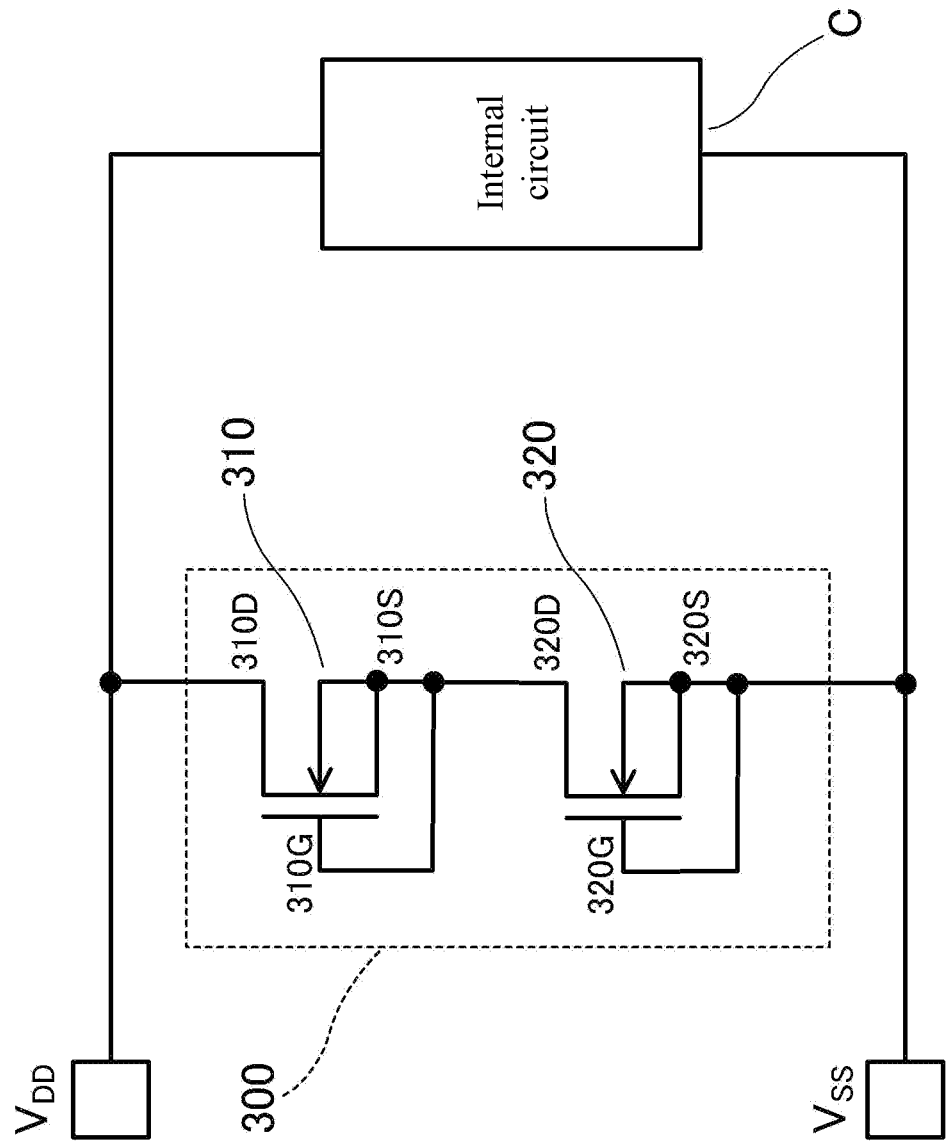
FIG. 5 is a circuit diagram illustrating an ESD protection circuit and a semiconductor device according to a second embodiment.

FIG. 5 is a circuit diagram illustrating an ESD protection circuit and a semiconductor device according to the second embodiment. As illustrated in FIG. 5, a semiconductor device 30 according to the second embodiment is similar to that in the first embodiment except that the ESD protection circuit 200 of the semiconductor device 20 in the first embodiment is replaced with an ESD protection circuit 300 formed of two NMOS transistors having different withstand voltages. Thus, details of the ESD protection circuit 300 will be described below.

The ESD protection circuit 300 is formed by connecting a high withstand voltage NMOS transistor 310 and a low withstand voltage NMOS transistor 320 in series. The high withstand voltage NMOS transistor 310 includes a drain 310D connected to the $V_{DD}$ terminal. The low withstand voltage NMOS transistor 320 includes a drain 320D connected to a source 310s and a gate 310G of the high withstand voltage NMOS transistor 310, and a source 320S and a gate 320G connected to the $V_{SS}$ terminal. In FIG. 5, the high withstand voltage NMOS transistor 310 is arranged on the $V_{DD}$ terminal side, and the low withstand voltage NMOS transistor 320 is arranged on the $V_{SS}$ terminal side, but the low withstand voltage NMOS transistor 320 may also be arranged on the $V_{DD}$ terminal side, and the high withstand voltage NMOS transistor 310 may also be arranged on the $V_{SS}$ terminal side. In either case, equivalent breakdown voltage BV, trigger voltage Vtrig, and holding voltage Vh may be obtained. However, since the ESD tolerance may change depending on the arrangement sequence, the arrangement sequence is appropriately selected.

Figure 6A:
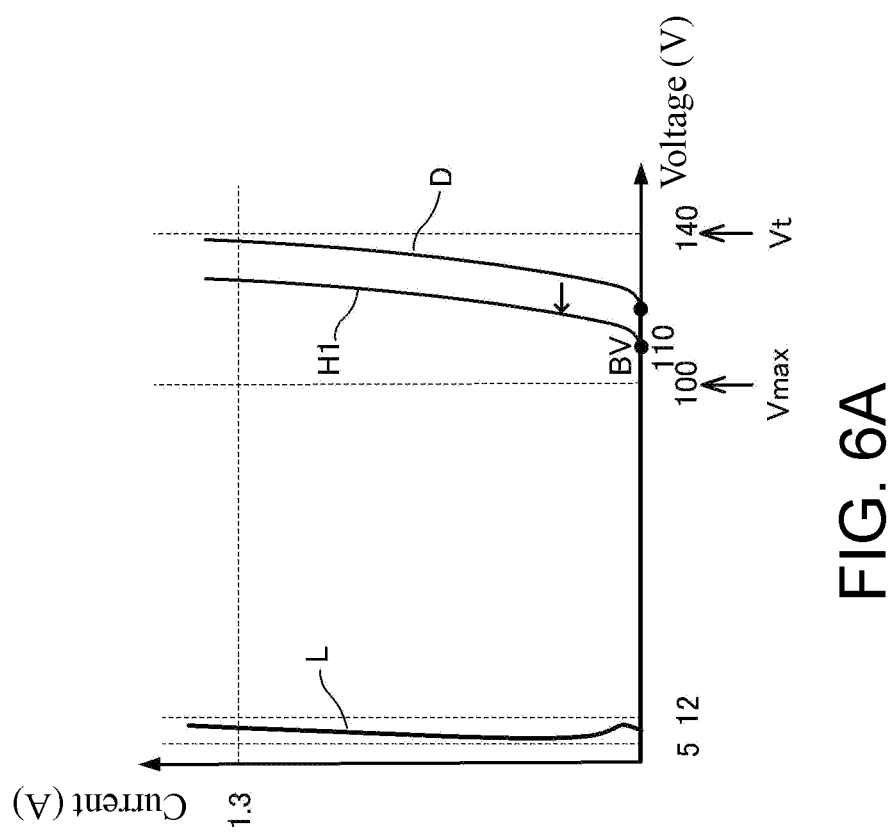
FIG. 6A is a graph illustrating current-voltage characteristics of a high withstand voltage NMOS transistor and a low withstand voltage transistor according to the second embodiment.

FIG. 6A is a graph illustrating current-voltage characteristics of the high withstand voltage NMOS transistor and the low withstand voltage transistor according to the second embodiment. As indicated by H1 in FIG. 6A, with the increased collector-emitter resistance, the breakdown voltage BV of the high withstand voltage NMOS transistor 310 is set to 110 V. Thus, since the breakdown voltage BV is higher than 100 V which is the maximum operating voltage Vmax of the internal circuit C, the high withstand voltage NMOS transistor 310 can reduce a leak current during operation of the internal circuit C.

In addition, with an increased gate width W, the high withstand voltage NMOS transistor 310 has a current-voltage characteristic like a diode, and the current reaches 1.3 A within a range lower than 140 V, which is the damage voltage Vit of the internal circuit C. In other words, the current-voltage characteristic of the high withstand voltage NMOS transistor 310 is obtained by shifting the current-voltage characteristic indicated by D in FIG. 14 lower by 10 V, and can be realized without changing the manufacturing process. In addition, with the high withstand voltage NMOS transistor 310, compared to the NMOS transistor having the current-voltage characteristic indicated by D in FIG. 14, the layout area can be reduced by an amount based on the shift of the current-voltage characteristic lower by 10 V, and can be set to about 200 μm×200 m.

As indicated by L in FIG. 6A, the current-voltage characteristic of the low withstand voltage NMOS transistor 320 is similar to the current-voltage characteristic indicated by L in FIG. 13 and FIG. 14. Thus, the layout area of the low withstand voltage NMOS transistor 320 can be set to about 70 μm×70 μm.

Figure 6B:
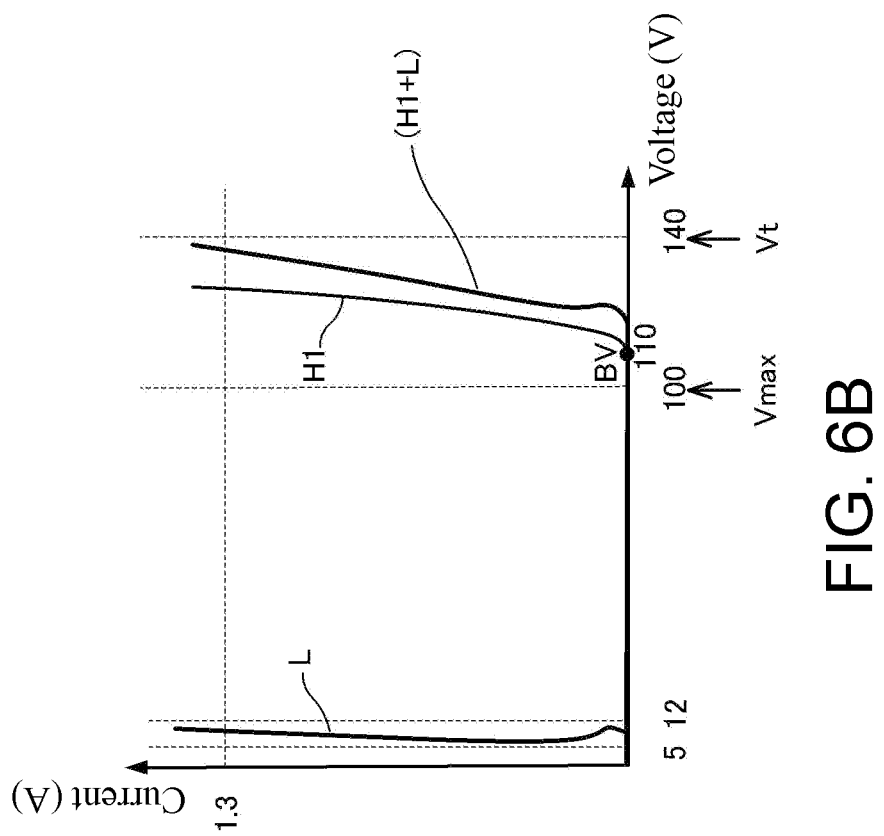
FIG. 6B is a graph illustrating current-voltage characteristics of the high withstand voltage NMOS transistor, the low withstand voltage transistor, and the ESD protection circuit according to the second embodiment.

The current-voltage characteristic of the ESD protection circuit 300 is obtained by adding the current-voltage characteristic of the low withstand voltage NMOS transistor 320 to the current-voltage characteristic of the high withstand voltage NMOS transistor 310, as indicated by (H1+L) in FIG. 6B. That is, the current-voltage characteristic of the ESD protection circuit 300 indicated by (H1+L) is within a range higher than the maximum operating voltage Vmax of 100 V and lower than the damage voltage Vit of 140 V, until reaching 1.3 A required for protecting against electrostatic discharge. Thus, the ESD protection circuit 300 can protect the internal circuit C from electrostatic discharge.

Also, the layout area of the ESD protection circuit 300 may be obtained by adding 70 μm×70 μm (4,900 μm$^2$) of the low withstand voltage NMOS transistor 320 to 200 μm×200 μm (40,000 μm$^2$) of the high withstand voltage NMOS transistor 310. Then, compared to the layout area of 400 μm×400 μm (160,000 μm$^2$) of the MOS transistor associated with the current-voltage characteristic indicated by D in FIG. 14, the layout area of the ESD protection circuit 300 can be reduced by about 70%.

In this manner, the ESD protection circuit 300 can protect the internal circuit C from electrostatic discharge, and can reduce the layout area even with an internal circuit C having a high withstand voltage.

Next, an example of the structure of the high withstand voltage NMOS transistor 310 will be described with reference to FIG. 7 and FIG. 8.

Figure 7:
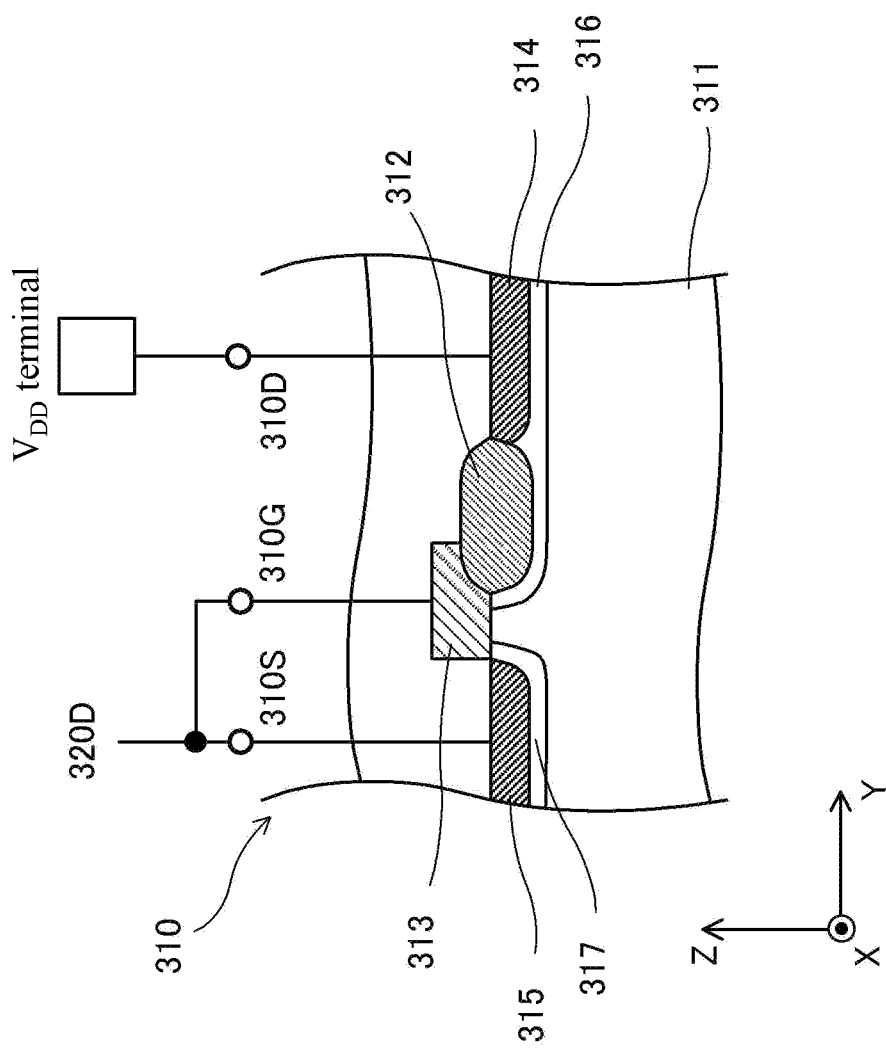
FIG. 7 is a schematic cross-sectional view illustrating an example of the structure of the high withstand voltage NMOS transistor according to the second embodiment.

FIG. 7 is a schematic cross-sectional view illustrating an example of the structure of the high withstand voltage NMOS transistor according to the second embodiment. As illustrated in FIG. 7, the high withstand voltage NMOS transistor 310 has a so-called double-diffused MOS (DMOS) structure.

In particular, a local oxidation of silicon (LOCOS) 312 is formed as a field oxide film on the surface of an N-type semiconductor substrate 311. A gate electrode 313 is formed of polysilicon to partially cover the LOCOS 312. A drain region 314 and a source region 315 are respectively formed as N-type high-concentration regions on the semiconductor substrate 311 to sandwich the LOCOS 312 and the gate electrode 313 in a plan view. An N-type drift layer 316 is formed inside the semiconductor substrate 311 to contact peripheries of the bottom surface and the side surface respectively of the LOCOS 312 and the drain region 314. A P-type well layer 317 is formed to contact peripheries of the bottom surface and the side surface of the source region 315. The gate electrode 313, the drain region 314, and the source region 315 are respectively connected to the gate 310G, the drain 310D, and the source 310s.

With the high withstand voltage NMOS transistor 310 having such a DMOS structure, it is advantageous in that the withstand voltage can be easily adjusted by adjusting the length of the LOCOS 312 in the Y-axis direction.

Figure 8:
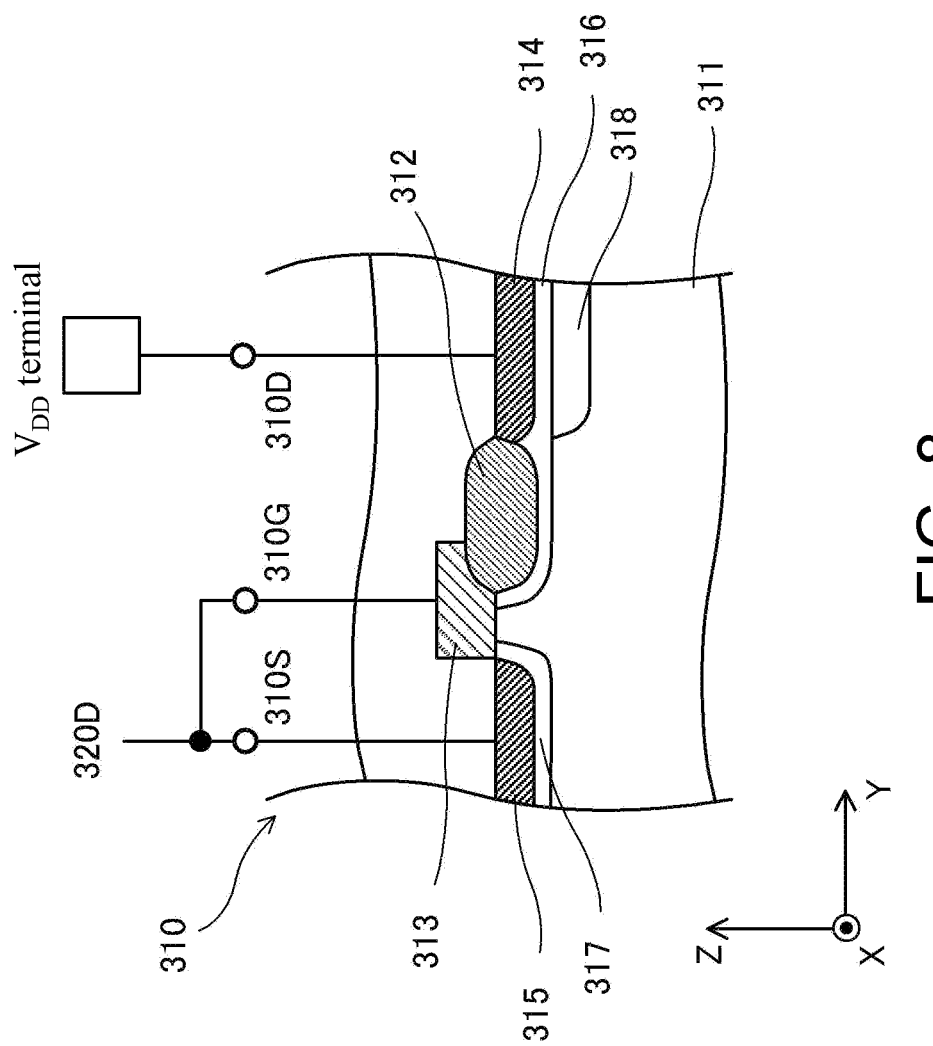
FIG. 8 is a schematic cross-sectional view illustrating another example of the structure of the high withstand voltage NMOS transistor according to the second embodiment.

Further, as illustrated in FIG. 8, an N-type low-concentration region 318 may be formed to be in contact with a part of, or at least partially overlap with, the bottom surface of the N-type drift layer 316. With the structure illustrated in FIG. 8, without changing the length of the LOCOS 312 in the Y-axis direction, the withstand voltage can be adjusted by adjusting the length of the low-concentration region 318 in the Y-axis direction, and the surge voltage tolerance can be improved.

In this embodiment, the structure of the high withstand voltage NMOS transistor is a DMOS structure, but the structure is not limited thereto and may also be, for example, a laterally double diffused MOS (LDMOS) structure, a lightly doped drain (LDD) structure, etc. Also, a salicide block region may be formed at each MOS transistor. Furthermore, in this embodiment, N-channel MOS transistors are used as the high withstand voltage MOS transistor and the low withstand voltage MOS transistor, but the embodiment is not limited thereto, and at least one of the high withstand voltage MOS transistor and the low withstand voltage MOS transistor may also be a P-channel MOS transistor. Thus, the holding voltage Vh can be increased.

Modification Example of Second Embodiment

Figure 9:
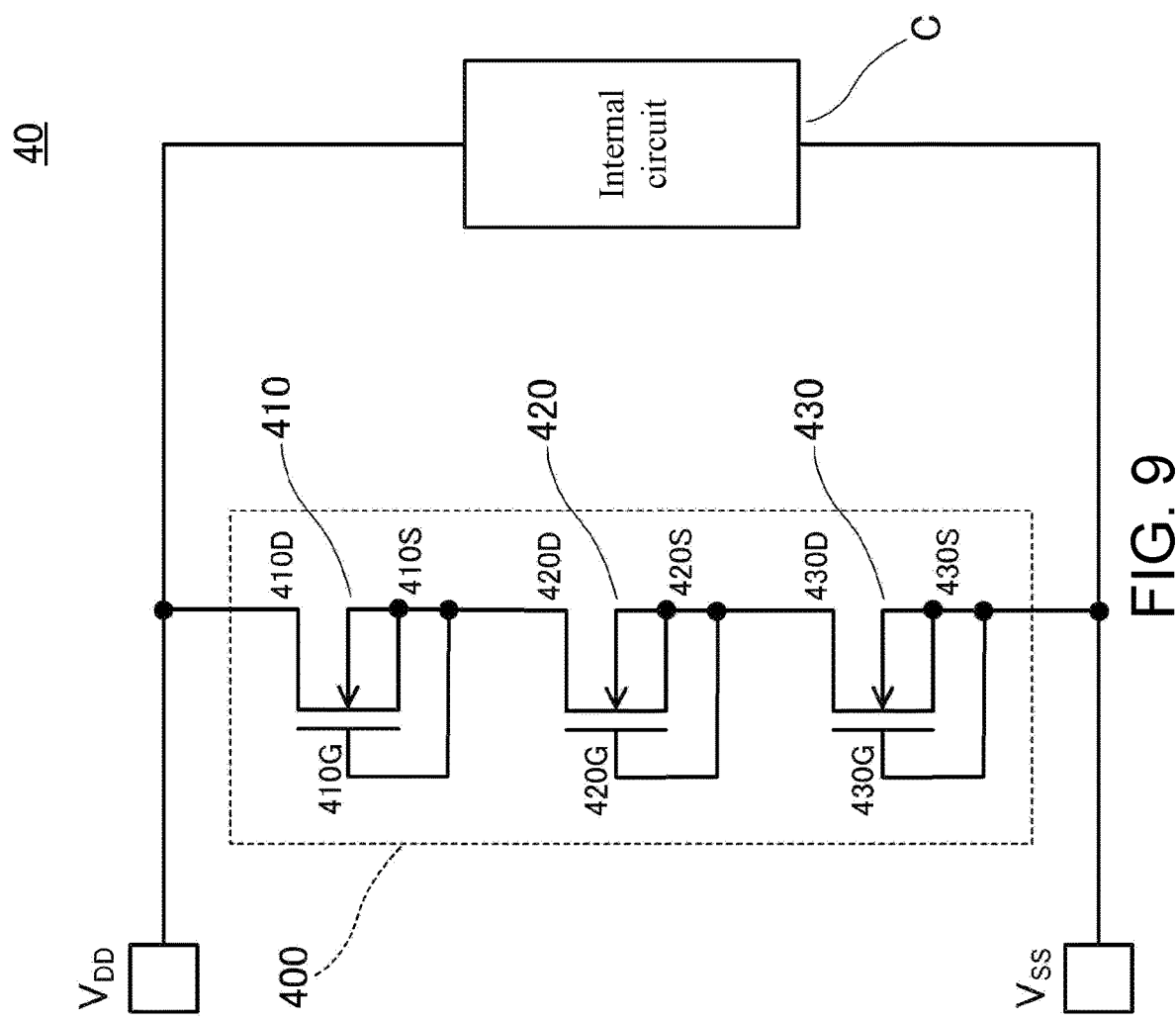
FIG. 9 is a circuit diagram illustrating an ESD protection circuit and a semiconductor device according to a modification example of the second embodiment.

FIG. 9 is a circuit diagram illustrating an ESD protection circuit and a semiconductor device according to a modification example of the second embodiment. As illustrated in FIG. 9, a semiconductor device 40 according to the modification example of the second embodiment is similar to the semiconductor device 30 except that the breakdown voltage BV of the high withstand voltage NMOS transistor 310 in the ESD protection circuit 300 illustrated in FIG. 5 is set to 100V, and a low withstand voltage NMOS transistor 430 is further connected in series between the low withstand voltage NMOS transistor 320 and the $V_{SS}$ terminal. Also, low withstand voltage NMOS transistors 420 and 430 have the same structure and current-voltage characteristic as the low withstand voltage NMOS transistor 320. That is, an ESD protection circuit 400 according to the modification example of the second embodiment is similar to the ESD protection circuit 300 according to the second embodiment except that the high withstand voltage NMOS transistor 310 is replaced with a high withstand voltage NMOS transistor 410 having a breakdown voltage BV set to 100 V, and that a low withstand voltage NMOS transistor 430 similar to the low withstand voltage NMOS transistor 320 is further connected in series between the low withstand voltage NMOS transistor 320 and the $V_{SS}$ terminal.

Figure 10:
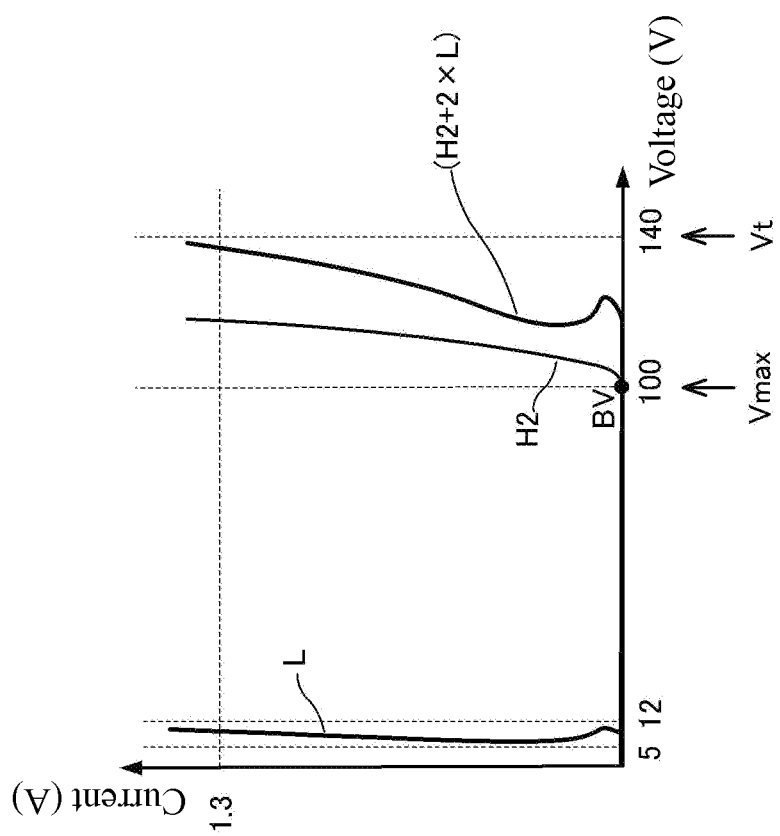
FIG. 10 is a graph illustrating current-voltage characteristics of the high withstand voltage NMOS transistor, the low withstand voltage transistor, and the ESD protection circuit according to the modification example of the second embodiment.

FIG. 10 is a graph illustrating current-voltage characteristics of the high withstand voltage NMOS transistor, the low withstand voltage transistor, and the ESD protection circuit according to the modification example of the second embodiment. In FIG. 10, H2 indicates the current-voltage characteristic of the high withstand voltage NMOS transistor 410 with a breakdown voltage BV set to 100 V, and L indicates the current-voltage characteristic of the low withstand voltage NMOS transistor 420 and the low withstand voltage NMOS transistor 430.

As indicated by H2 in FIG. 10, with the collector-emitter resistance being set to be lower than that of the high withstand voltage NMOS transistor 310, the breakdown voltage BV of the high withstand voltage NMOS transistor 410 is set to 100 V. Further, similar to the high withstand voltage NMOS transistor 310, the high withstand voltage NMOS transistor 410 has an increased gate width W, which is nonetheless narrowed by an amount based on lowering of the breakdown voltage BV compared to the high withstand voltage NMOS transistor 310. In other words, the current-voltage characteristic of the high withstand voltage NMOS transistor 410 is obtained by shifting the current-voltage characteristic indicated by D in FIG. 14 lower by 20 V and can be realized without changing the manufacturing process. In addition, with the high withstand voltage NMOS transistor 410, compared to the NMOS transistor having the current-voltage characteristic indicated by D in FIG. 14, the layout area can be reduced by an amount based on the shift of the current-voltage characteristic lower by 20 V, and can be set to about 150 μm×150 μm.

Similar to the low withstand voltage NMOS transistor 320, the current-voltage characteristic of the low withstand voltage NMOS transistor 430 is the current-voltage characteristic indicated by L in FIG. 6A and FIG. 6B. Thus, similar to the low withstand voltage NMOS transistor 320, the layout area of the low withstand voltage NMOS transistor 430 can be set to about 70 μm×70 μm.

The current-voltage characteristic of the ESD protection circuit 400 is obtained by adding the current-voltage characteristics of the low withstand voltage NMOS transistors 420 and 430 to the current-voltage characteristic of the high withstand voltage NMOS transistor 410, as indicated by (H2+2×L) in FIG. 10. That is, the current-voltage characteristic of the ESD protection circuit 400 indicated by (H2+2×L) is within a range higher than or equal to the maximum operating voltage Vmax of 100 V and lower than or equal to the damage voltage Vit of 140 V until reaching 1.3 A. Thus, the ESD protection circuit 400 can protect the internal circuit C from electrostatic discharge.

Also, the layout area of the ESD protection circuit 400 can be obtained by adding 70 μm×70 μm respectively of the low withstand voltage NMOS transistors 420 and 430 to 150 μm×150 μm of the high withstand voltage NMOS transistor 410, which becomes 32,300 μm². Then, compared to the layout area of 400 μm×400 μm (160,000 μm²) of the MOS transistor associated with the current-voltage characteristic indicated by D in FIG. 14, the layout area of the ESD protection circuit 400 can be reduced by about 80%. Thus, in the modification example of the second embodiment, even though the quantity of MOS transistors is increased, the layout area can be reduced compared to the second embodiment.

Third Embodiment

Figure 11:
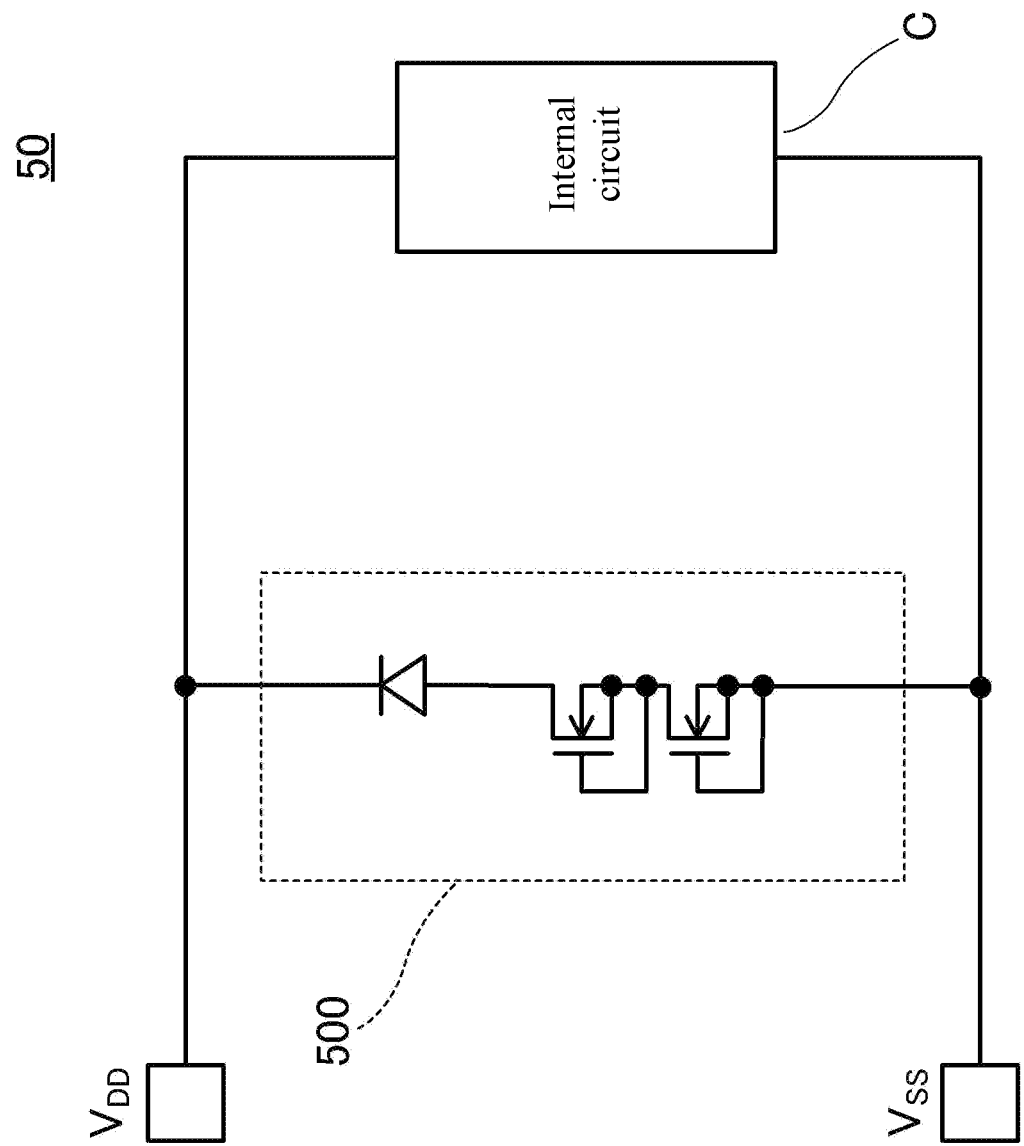
FIG. 11 is a circuit diagram illustrating an ESD protection circuit and a semiconductor device according to a third embodiment.

FIG. 11 is a circuit diagram illustrating an ESD protection circuit and a semiconductor device according to the third embodiment. As illustrated in FIG. 11, an ESD protection circuit 500 and a semiconductor device 50 according to the third embodiment include at least diode elements as the plurality of ESD protection elements. FIG. 11 illustrates that the ESD protection circuit 500 is formed by connecting both high withstand voltage diode elements and low withstand voltage NMOS transistors in series. The low withstand voltage NMOS transistors are so-called diode-connected, with gate terminals being respectively connected to source terminals.

Figure 12:
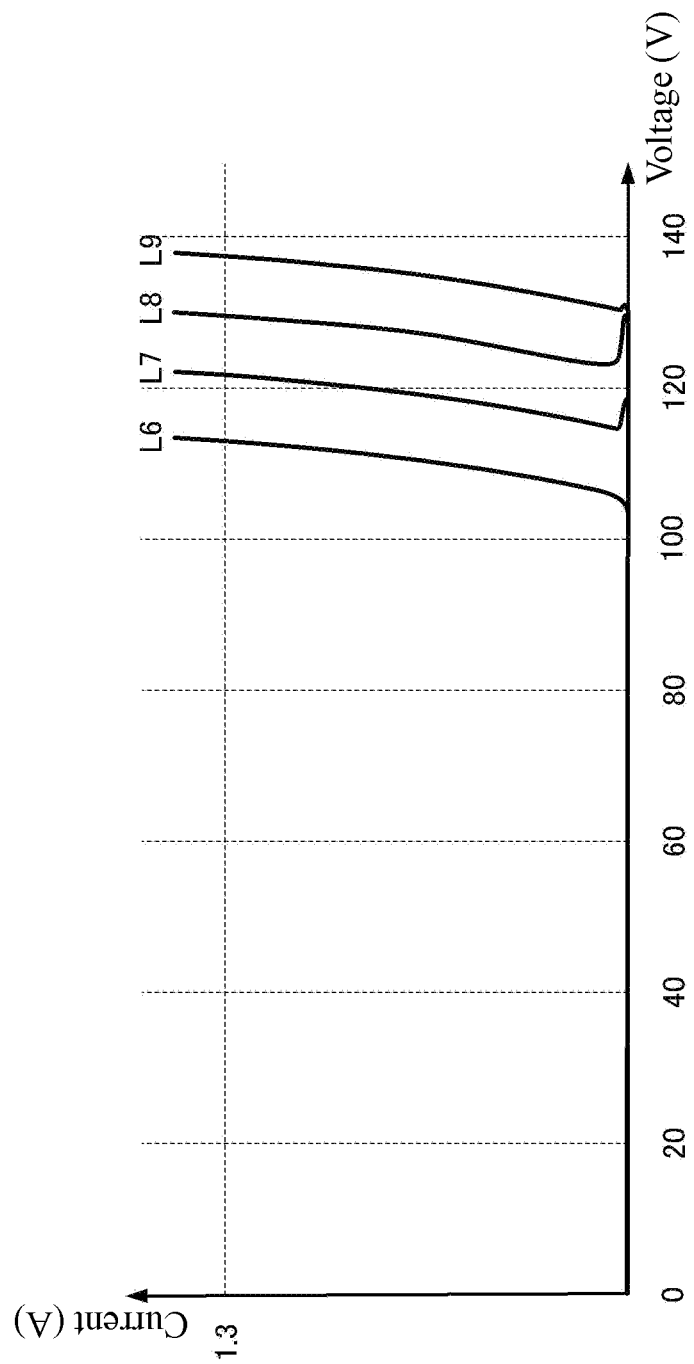
FIG. 12 is a graph illustrating some examples of the current-voltage characteristic of the ESD protection circuit according to the third embodiment.

Next, the current-voltage characteristic of the ESD protection circuit 500 in the case where the plurality of ESD protection elements include high withstand voltage diode elements will be described. FIG. 12 is a graph illustrating some examples of the current-voltage characteristic of the ESD protection circuit according to the third embodiment. L6 to L9 in FIG. 12 indicate the current-voltage characteristic of the ESD protection circuit 500 formed by connecting high withstand voltage diode elements and low withstand voltage NMOS transistors or low withstand voltage PMOS transistors in series in the following quantities.

L6: 1 high withstand voltage diode element
L7: 1 high withstand voltage diode element, 1 low withstand voltage NMOS transistor
L8: 1 high withstand voltage diode element, 2 low withstand voltage NMOS transistors
L9: 1 high withstand voltage diode element, 2 low withstand voltage PMOS transistors As illustrated in FIG. 12, the current-voltage characteristic of the ESD protection circuit 500 may be adjusted by the quantity of low withstand voltage NMOS transistors or low withstand voltage PMOS transistors. The low withstand voltage NMOS transistor and the low withstand voltage PMOS transistor have the same breakdown voltage BV, but the N-channel MOS transistor has a larger snapback operation than the P-channel MOS transistor. Thus, the ESD protection circuit 500 using the low withstand voltage NMOS transistor can reduce the voltage for passing the discharge current of 1.3 A required for protecting against electrostatic discharge of 2 kV in the HBM. Thus, the ESD protection circuit 500 using the low withstand voltage NMOS transistor can allow the discharge current to flow easily before the discharge voltage due to electrostatic discharge approaches the damage voltage of the internal circuit C, and the internal circuit C can be more reliably protected from electrostatic discharge.

From this point of view, for example, in the case where the damage voltage of the internal circuit C is 140 V and the operating voltage of the internal circuit C is 110 V, since the current-voltage characteristic indicated by L7 in FIG. 12 is optimal, the ESD protection circuit 500 may be formed of one high withstand voltage diode element and one low withstand voltage NMOS transistor. Also, in the case where the operating voltage of the internal circuit C is 120 V, since the current-voltage characteristic indicated by L8 in FIG. 12 is optimal, the ESD protection circuit 500 may be formed of one high withstand voltage diode element and two low withstand voltage NMOS transistors. Furthermore, in the case where the operating voltage of the internal circuit C is 130 V, since the current-voltage characteristic indicated by L9 in FIG. 12 is optimal, the ESD protection circuit 500 may be formed of one high withstand voltage diode element and two low withstand voltage PMOS transistors.

Thus, by combining the high withstand voltage diode element with the low withstand voltage NMOS transistor or the low withstand voltage PMOS transistor, the ESD protection circuit 500 according to the third embodiment can obtain a current-voltage characteristic corresponding to the operating voltage and the damage voltage of the internal circuit C. In particular, since the snapback operation increases as the quantity of low withstand voltage NMOS transistors increases, the ESD protection circuit 500 can flow the discharge current required for protecting the internal circuit C at a lower voltage, and the internal circuit C can be protected more reliably.

In the third embodiment, the high withstand voltage diode element is combined with the low withstand voltage NMOS transistor or the low withstand voltage PMOS transistor, but the high withstand voltage diode element may also be combined with both the low withstand voltage NMOS transistor and the low withstand voltage PMOS transistor. Further, although the high withstand voltage diode element is adopted in the third embodiment, the embodiment is not limited thereto, and a low withstand voltage diode element may also be adopted, or a combination of a high withstand voltage diode element and a low withstand voltage diode element may also be adopted.

As described above, the ESD protection circuit according to each embodiment of the present invention is connected between a first terminal and a second terminal and is connected in parallel with a protected circuit which operates at an operating voltage and is damaged at a damage voltage or higher. The ESD protection circuit includes a plurality of ESD protection elements connected in series, and the plurality of ESD protection elements are transistors, diode elements, or a combination thereof. By appropriately selecting the plurality of ESD protection elements, a sum of current-voltage characteristics of the plurality of ESD protection elements at a voltage higher than the operating voltage is set to be higher than the operating voltage and lower than the damage voltage of the protected circuit, until reaching a discharge current value or higher capable of protecting the protected circuit. Thus, the ESD protection circuit can obtain a current-voltage characteristic corresponding to the operating voltage and the damage voltage of the protected circuit and can avoid damage due to electrostatic discharge without interfering with the operation of the protected circuit. Further, with the plurality of ESD protection elements being combined and the breakdown voltage of at least one ESD protection element being different from the breakdown voltage of other ESD protection elements, since the breakdown voltage and the holding voltage can be finely adjusted, it becomes easier to protect the protected circuit. Specifically, in the case where only transistors with a breakdown voltage of 10 V are combined, the sum of breakdown voltages is incremented by 10 V, but if transistors with a breakdown voltage of 15 V are combined, the sum is incremented by 5 V and can be finely adjusted.

Although the embodiments of the present invention have been described in detail above, the present invention is not limited to these embodiments and also includes designs and the like which do not depart from the gist of the present invention. Specifically, in each embodiment, the first terminal is the $V_{DD}$ terminal, but the first terminal is not limited thereto and may also be, for example, an input port or an output port of a signal. In each embodiment, the snapback of the MOS transistor is utilized, i.e., the operation of the parasitic bipolar transistor of the MOS transistor is utilized, but the embodiment is not limited thereto, and a bipolar transistor may also be adopted.

Furthermore, although several examples of the arrangement sequence of the ESD protection elements are illustrated in the embodiments, since other characteristics such as latch-up resistance may change depending on the arrangement sequence, an appropriate selection may be made in further consideration of characteristics other than ESD-associated characteristics. In addition, in terms of the ability to improve latch-up resistance, a deep trench called deep trench isolation may be formed in the silicon semiconductor substrate between the ESD protection elements, and thus the distance between the ESD protection elements can also be narrowed. For each ESD protection element, its shape, structural channel width, junction peripheral length, and area are also appropriately selected.

What is claimed is:

1. An ESD protection circuit, which is connected between a first terminal and a second terminal and is connected in parallel with a protected circuit that operates at an operating voltage and is damaged at a damage voltage or higher to protect the protected circuit from electrostatic discharge, the ESD protection circuit comprising:
    a plurality of ESD protection elements connected in series, wherein
    the plurality of ESD protection elements are transistors, diode elements, or a combination thereof, and
    a sum of current-voltage characteristics of the plurality of ESD protection elements at a voltage higher than the operating voltage is higher than the operating voltage and lower than the damage voltage, until reaching a discharge current value or higher capable of protecting the protected circuit.

2. The ESD protection circuit according to claim 1, wherein a breakdown voltage of the sum of the current-voltage characteristics of the plurality of ESD protection elements is higher than the operating voltage.

3. The ESD protection circuit according to claim 1, wherein
    the plurality of ESD protection elements comprise the transistors, and
    a holding voltage of the sum of the current-voltage characteristics of the plurality of ESD protection elements is higher than the operating voltage.

4. The ESD protection circuit according to claim 1, wherein the transistors are MOS transistors or bipolar transistors.

5. The ESD protection circuit according to claim 4, wherein the MOS transistors are N-channel MOS transistors or P-channel MOS transistors and have withstand voltages equal to or different from withstand voltages of other ESD protection elements.

6. The ESD protection circuit according to claim 5, wherein the plurality of ESD protection elements comprise the N-channel MOS transistors and the P-channel MOS transistors.

7. The ESD protection circuit according to claim 4, wherein the MOS transistors have DMOS structures.

8. The ESD protection circuit according to claim 1, wherein the plurality of ESD protection elements comprise the transistors and the diode elements.

9. The ESD protection circuit according to claim 1, wherein the diode elements have withstand voltages equal to or different from withstand voltages of other ESD protection elements.

10. The ESD protection circuit according to claim 1, wherein a breakdown voltage of at least one ESD protection element among the plurality of ESD protection elements is different from breakdown voltages of other ESD protection elements.

11. A semiconductor device, wherein the ESD protection circuit according to claim 1 and a protected circuit to be protected by the ESD protection circuit from electrostatic discharge are connected in parallel.

* * * * *